(12) United States Patent
Hymas et al.

(10) Patent No.: US 10,546,947 B2
(45) Date of Patent: Jan. 28, 2020

(54) MEMORY CELL WITH OXIDE CAP AND SPACER LAYER FOR PROTECTING A FLOATING GATE FROM A SOURCE IMPLANT

(71) Applicant: Microchip Technology Incorporated, Chandler, AZ (US)

(72) Inventors: Mel Hymas, Camas, WA (US); Bomy Chen, Newark, CA (US); Greg Stom, Rhododendron, OR (US); James Walls, Mesa, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/110,330

(22) Filed: Aug. 23, 2018

(65) Prior Publication Data

US 2019/0097027 A1   Mar. 28, 2019

Related U.S. Application Data

(60) Provisional application No. 62/564,174, filed on Sep. 27, 2017.

(51) Int. Cl.
*H01L 21/265* (2006.01)
*H01L 21/28* (2006.01)
(Continued)

(52) U.S. Cl.
CPC .. *H01L 29/66825* (2013.01); *H01L 21/26513* (2013.01); *H01L 21/31053* (2013.01);
(Continued)

(58) Field of Classification Search
CPC ............ H01L 27/115; H01L 27/11519; H01L 27/11517; H01L 29/42324;
(Continued)

(56) References Cited

U.S. PATENT DOCUMENTS

| 5,858,840 A | 1/1999 | Hsieh et al. ................ 438/266 |
| 5,872,036 A * | 2/1999 | Sheu ................ H01L 29/42324 |
| | | 257/E21.422 |

(Continued)

OTHER PUBLICATIONS

International Search Report and Written Opinion, Application No. PCT/US2018/052900, 15 pages, dated Feb. 4, 2019.

*Primary Examiner* — Zandra V Smith
*Assistant Examiner* — Jeremy J Joy
(74) *Attorney, Agent, or Firm* — Slayden Grubert Beard PLLC

(57) ABSTRACT

A method of forming a memory cell, e.g., flash memory cell, may include (a) depositing polysilicon over a substrate, (b) depositing a mask over the polysilicon, (c) etching an opening in the mask to expose a surface of the polysilicon, (d) growing a floating gate oxide at the exposed polysilicon surface, (e) depositing additional oxide above the floating gate oxide, such that the floating gate oxide and additional oxide collectively define an oxide cap, (f) removing mask material adjacent the oxide cap, (g) etching away portions of the polysilicon uncovered by the oxide cap, wherein a remaining portion of the polysilicon defines a floating gate, and (h) depositing a spacer layer over the oxide cap and floating gate. The spacer layer may includes a shielding region aligned over at least one upwardly-pointing tip region of the floating gate, which helps protect such tip region(s) from a subsequent source implant process.

14 Claims, 6 Drawing Sheets

(51) Int. Cl.
  *H01L 21/3105* (2006.01)
  *H01L 21/3213* (2006.01)
  *H01L 29/423* (2006.01)
  *H01L 29/66* (2006.01)
  *H01L 29/788* (2006.01)

(52) U.S. Cl.
  CPC .. *H01L 21/32139* (2013.01); *H01L 29/66484* (2013.01); *H01L 29/788* (2013.01)

(58) Field of Classification Search
  CPC ............. H01L 29/66825; H01L 29/788; H01L 21/28273; H01L 21/31051; H01L 21/3147; H01L 21/32; H01L 21/31–3105; H01L 21/3165–31675; H01L 21/32105; H01L 21/02255
  See application file for complete search history.

(56) References Cited

U.S. PATENT DOCUMENTS

| | | | |
|---|---|---|---|
| 5,970,371 A * | 10/1999 | Hsieh | H01L 29/66825 257/E21.422 |
| 5,972,753 A | 10/1999 | Lin et al. | 438/265 |
| 6,093,608 A * | 7/2000 | Lin | H01L 29/40114 438/266 |
| 6,159,801 A | 12/2000 | Hsieh et al. | 438/259 |
| 6,333,228 B1 | 12/2001 | Hsieh et al. | 438/257 |
| 6,747,310 B2 * | 6/2004 | Fan | H01L 27/11521 257/316 |
| 7,214,589 B2 * | 5/2007 | Liu | H01L 27/115 257/E21.682 |
| 2002/0110972 A1 | 8/2002 | Chen et al. | 438/201 |
| 2002/0142545 A1 * | 10/2002 | Lin | H01L 27/115 438/257 |
| 2005/0063208 A1 * | 3/2005 | Park | G11C 16/0425 365/10 |
| 2007/0205436 A1 * | 9/2007 | Huang | H01L 27/115 257/213 |
| 2008/0093647 A1 * | 4/2008 | Kang | H01L 29/66825 257/314 |
| 2008/0149985 A1 * | 6/2008 | Liu | H01L 29/40114 257/315 |
| 2012/0168842 A1 * | 7/2012 | Wang | H01L 27/11521 257/316 |
| 2013/0244415 A1 * | 9/2013 | Wang | H01L 21/32139 438/591 |
| 2017/0062443 A1 * | 3/2017 | Mizushima | H01L 29/42328 |

\* cited by examiner

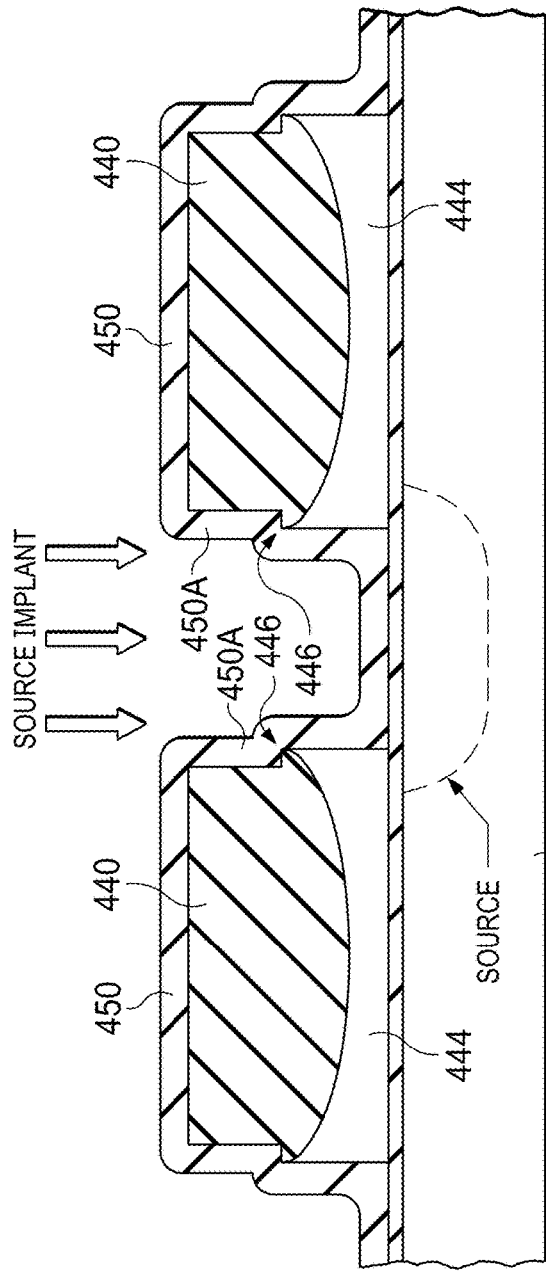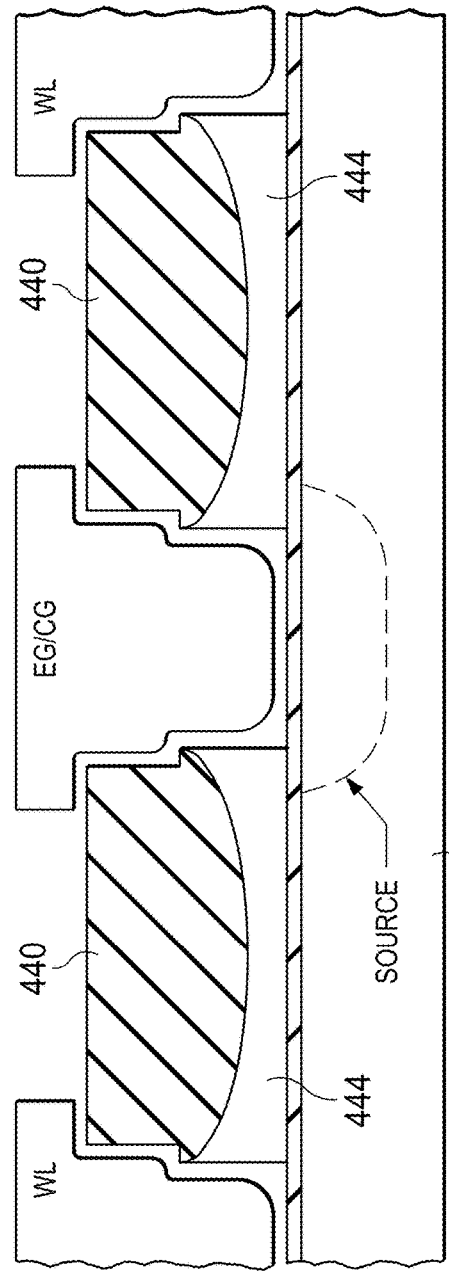

MEMORY CELL WITH OXIDE CAP AND SPACER LAYER FOR PROTECTING A FLOATING GATE FROM A SOURCE IMPLANT

RELATED PATENT APPLICATION

This application claims priority to commonly owned U.S. Provisional Patent Application No. 62/564,174 filed Sep. 27, 2017, the entire contents of which are hereby incorporated by reference for all purposes.

TECHNICAL FIELD

The present disclosure relates to memory cells, e.g., a flash memory cell structure including at least one floating gate having an oxide cap (e.g., flat-topped oxide cap) and overlying spacer layer to protect the floating gate from a source implant process, and corresponding methods.

BACKGROUND

Certain memory cells, e.g., flash memory cells, include at least one floating gate programmed and erased through one or more program/erase gates, word lines, or other conductive element(s). Some memory cells use a common program/erase gate extending over a floating gate to both program and erase the cell. In some implementations, the floating gate is formed by a Poly1 layer, while the program/erase gate is formed by a Poly2 layer that partially overlaps the underlying Poly1 floating gate in the lateral direction. For some memory cells, the manufacturing process includes a floating gate thermal oxidation process that forms a football-shaped oxide over the Poly1 floating gate, as discussed below.

FIG. 1 illustrates a partial cross-sectional view of an example memory cell 10A, e.g., a flash memory cell, including a Poly1 floating gate 14 and an overlying football-shaped oxide region ("football oxide") 16 formed over a substrate 12, and a Poly2 gate 18 (e.g., a word line, erase gate, or common program/erase gate) extending partially over the floating gate 14. The football oxide 16 is formed over the floating gate 14 by a thermal oxidation process on floating gate 14, which defines upwardly-pointing tips 15 at the edges of floating gate 14. One or more of these FG tips 15 may define a conductive coupling to adjacent program/erase gates. For example, the FG tip 15 on the right side of FG 14 shown in FIG. 1 may define a conductive coupling to the adjacent Poly2 gate 18.

After forming the floating gate 14 and football oxide 16, a source dopant implant may be performed, which is self-aligned by the lateral edge of the floating gate 14, followed by an anneal process that diffuses the source dopant outwardly such that the resulting source region extends partially under the floating gate 14, as shown in FIG. 1. However, during the source dopant implant, a portion of the dopant may penetrate through the football oxide 16 and into the underlying floating gate 14, which may result in a dulling or blunting of one or more floating gate tips 15, e.g., after subsequent oxidation steps (wherein the dopant absorbed in the floating gate 14 promotes oxidation of the floating gate tips 15). This dulling or blunting of the floating gate tip(s) 15 may decrease the efficiency of erase and/or program operations of the memory cell 10A.

FIGS. 2A and 2B illustrate example cross-sections taken at selected times during a conventional manufacturing process for a conventional flash memory cell including multiple floating gates. As shown in FIG. 2A, a Poly1 layer 30 may be deposited over a silicon substrate. A nitride layer may then be deposited and patterned using known techniques to form a hard mask 32. As shown in FIG. 2B, a floating gate oxidation process may then be performed, which forms a football oxide 16 over areas of the Poly1 layer 30 exposed through the nitride mask 32 (which subsequently defines the floating gates 14). The nitride mask 32 may subsequently be removed, followed by a plasma etch to remove portions of the Poly1 layer 30 uncovered by each football oxide 16, which defines the lateral extent of each floating gate 14. This may be followed by a source implant and/or formation of a Poly2 layer (e.g., to form a word line, erase gate, coupling gate, etc.), depending on the particular implementation.

FIG. 3 illustrates an example mirrored memory cell 10B (e.g., a SuperFlash ESF1 cell) including two spaced-apart floating gates 14, a word line 20 formed over each floating gate 14, a source region formed between and extending laterally below the two floating gates, and a bit line 18 on each side of the cell, each of which may be contacted by a bit line contact (not shown). In this cell, the source may be formed after forming the word lines 20, e.g., by an HVII implant and subsequent diffusion process. During the source implant, floating gate tips 15A that form conductive couplings with respective word lines 20 are protected from the source dopant by the overlying word lines 20. The interior floating gate tips 15B are relatively unprotected by the football oxides 16 and may thus become dulled or blunted by the dopant and subsequent oxidation, as discussed above. However, interior floating gate tips 15B are not used for conductive coupling and thus the dulling/blunting of floating gate tips 15B generally does not affect the operation of the cell.

Other types of cells include a gate or other operative structure formed over the source region that utilize the interior floating gate tips 15B for conductive coupling to the floating gates 14, e.g., the cell shown in FIG. 4.

FIG. 4 illustrates another example mirrored memory cell 10B (e.g., a SuperFlash ESF1+ cell) including two spaced-apart floating gates 14, a word line 20 formed over each floating gate 14, and a common erase gate or "coupling gate" 22 formed between and extending over both floating gates 14 (such that the program and erase couplings to each respective floating gate 14 may be decoupled), and a source region formed below the common erase gate. The inclusion of the erase gate may improve the cell shown in FIG. 3, e.g., by providing lower operating voltage and enhanced scalability. The word lines 20 and erase gate 22 may be formed simultaneously from a common poly layer. With this cell structure, implanting the source region before forming the word lines 20 and erase gate 22 may result in dulling/blunting of all floating gate tips 15A and 15B, as the tips may be protected only the by football oxides 16. Alternatively, implanting the source region after forming the word lines 20 and erase gate 22 may require a very high powered implant in order to penetrate through the erase gate 22 and into the substrate 12. Such high powered implant is typically costly and may also result in dulling/blunting of floating gate tips 15A and/or 15B.

One proposed technique to protect the floating gate tips during a source implant performed before forming the word lines and erase gate involves modifying the typical source implant mask so that the implant is spaced slightly away from the floating gate edge(s). However, there are drawbacks to such technique. First, scaling of this type of memory cell is generally limited due to photolithography limitations. For example, the space must be large enough to reliably open for the source implant. Second, the overlay alignment of the source implant mask is often imperfect, which introduces asymmetry into cell pairs.

SUMMARY

Some embodiments of the present invention provide an oxide cap formed over a floating gate structure, and a spacer layer (e.g., nitride spacer) formed over the oxide cap that helps to protect the floating gate, in particular at least one upwardly-pointing tip region of the floating gate, during a subsequent source implant process, and corresponding methods of manufacture. In some embodiments the oxide cap is relatively thick in the vertical direction and has a flat top, e.g., as a result of a CMP process.

Some embodiments provide memory cells that incorporate such floating gate/oxide cap structures, e.g., a non-volatile memory cells (e.g., flash memory cell) that includes a pair of floating gates, a word line formed over each floating gate, and a common erase/coupling gate formed between the floating gates and over the source region, and corresponding methods of manufacture. A pair of floating gate/oxide cap structures may be formed over a substrate, followed by a spacer layer formed over the oxide caps, followed by a source implant (prior to forming the word lines and erase/coupling gate) to form a source region between the pair of floating gates. The spacer layer helps protect the upwardly-pointing tips from the source implant, to thereby reduce or eliminate dulling or rounding of the tips that results in many conventional cells. The word lines and erase/coupling gate may then be formed over the structure, e.g., be depositing and etching a poly-2 layer.

In some embodiments, the memory cells may be SuperFlash non-volatile memory cells or variant thereof (e.g., ESF1 type cells or variants thereof that include an erase/coupling gate formed between the floating gates) by Microchip Technology Inc. having a headquarters at 2355 W Chandler Blvd, Chandler, Ariz. 85224.

BRIEF DESCRIPTION OF THE DRAWINGS

Example aspects of the present disclosure are described below in conjunction with the figures, in which:

FIGS. 8A and 8B illustrate an example process for forming a flash memory cell with a pair of floating gates, a pair of word lines, and a common erase/coupling gate formed between the floating gates and over the source region, including the techniques shown in FIGS. 6A-6F, according to one embodiment of the present invention.

DETAILED DESCRIPTION

Figure 1:
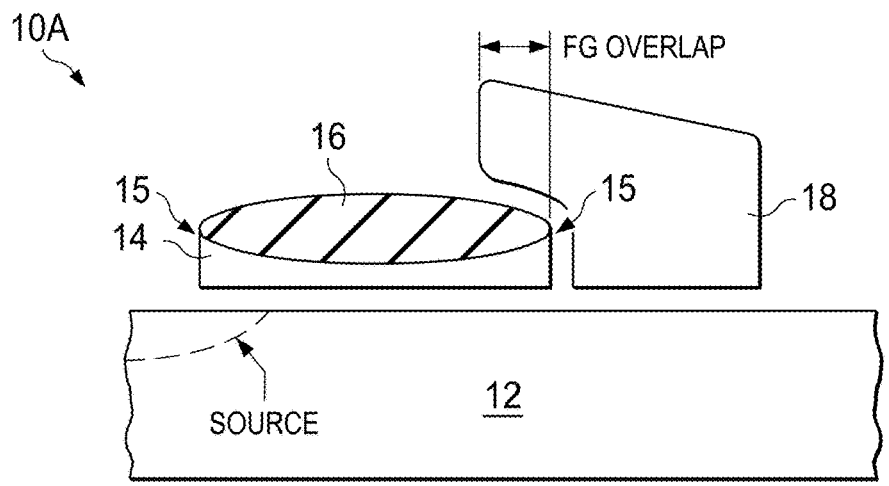
FIG. 1 illustrates a partial cross-sectional view of an example memory cell, e.g., flash memory cell, including a Poly1 floating gate with an overlying football oxide, and a Poly2 gate (e.g., a word line, erase gate, or common program/erase gate) extending over the floating gate.
Figure 2A:
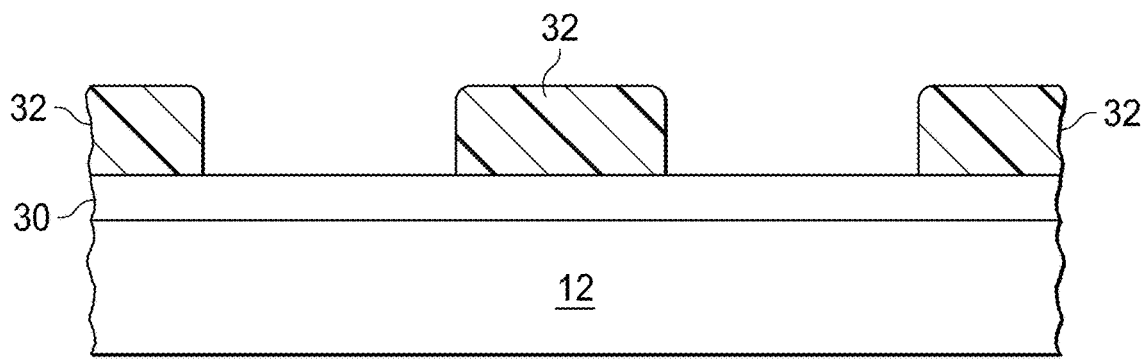
FIGS. 2A and 2B illustrate example cross-sections taken at selected times during a conventional manufacturing process for a conventional flash memory cell including multiple floating gates.
Figure 2B:
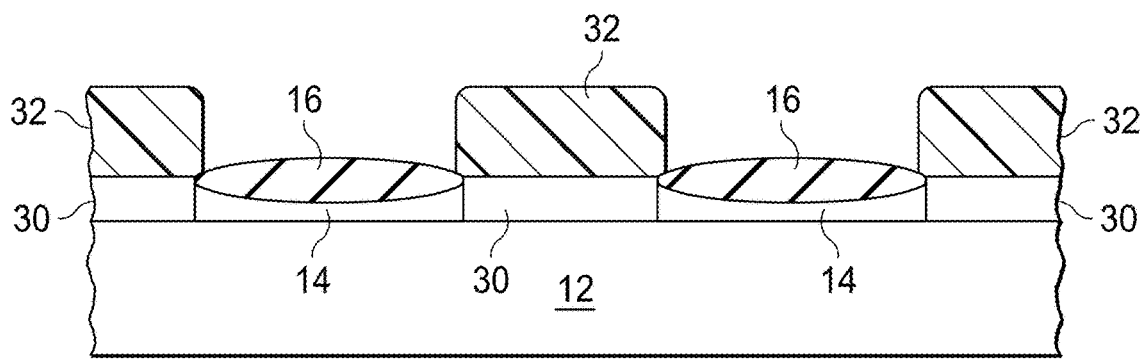
Figure 3:
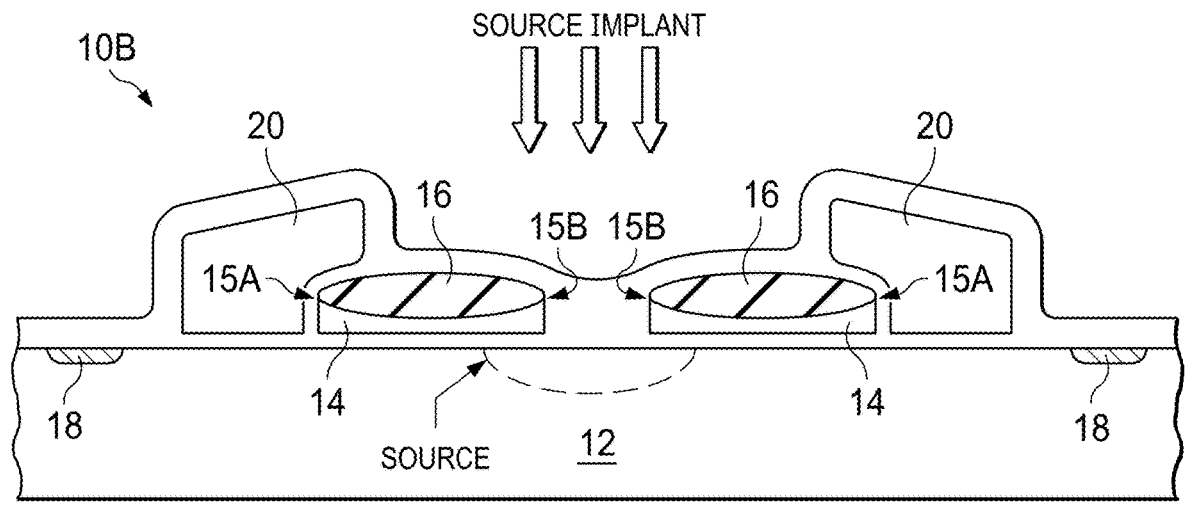
FIG. 3 illustrates an example mirrored memory cell, including a pair of floating gates, a word line formed over each floating gate, and source region formed between and extending under the floating gates.
Figure 4:
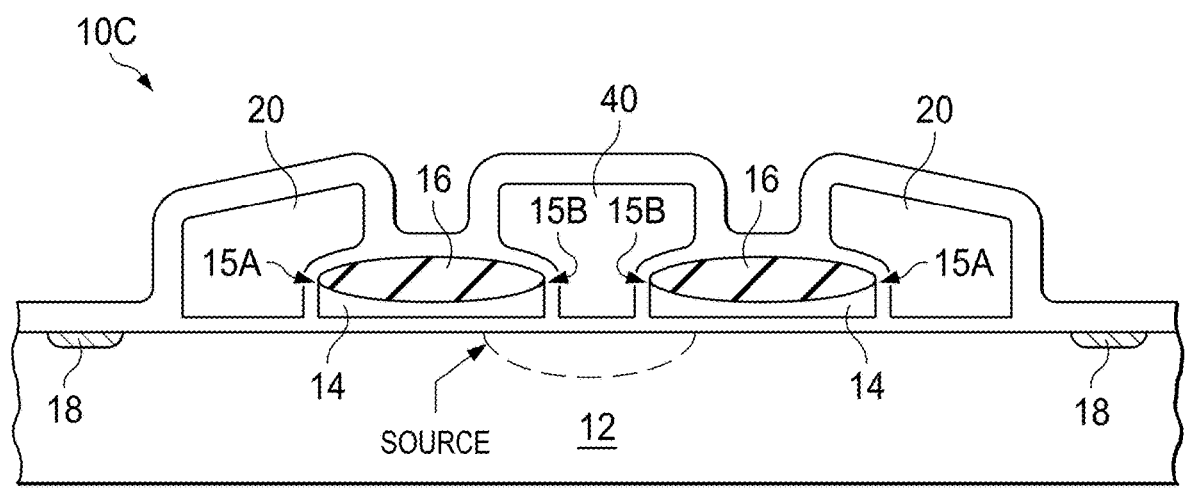
FIG. 4 illustrates another example mirrored memory cell, including a pair of floating gates, a word line formed over each floating gate, and a common erase gate or "coupling gate" extending over both floating gates and over the source region.
Figure 5:
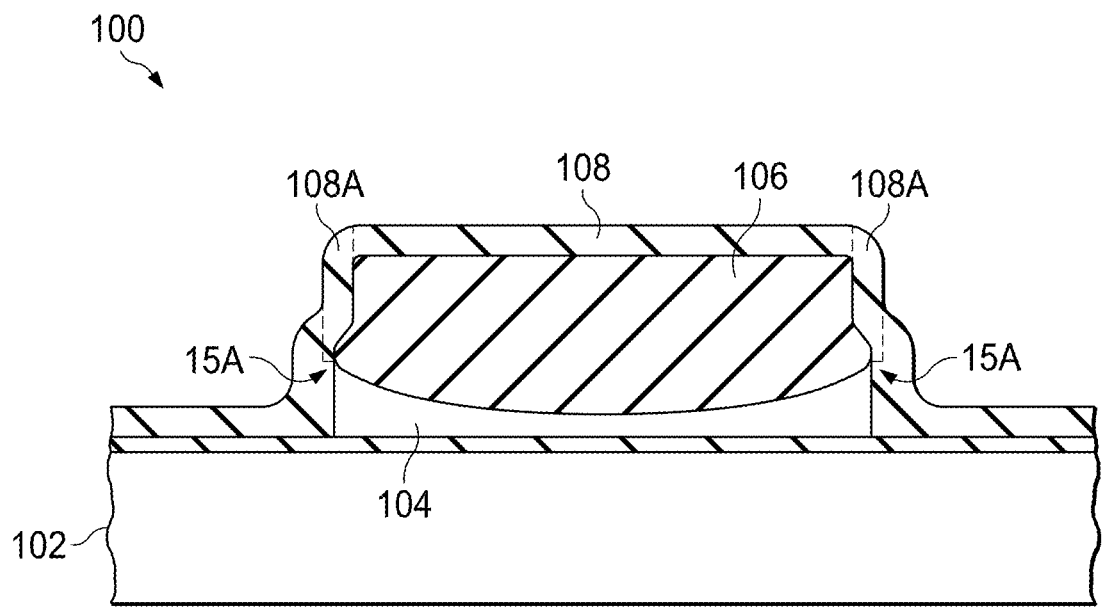
FIG. 5 illustrates a cross-section of an example memory cell structure including a flat-topped floating gate with an overlying flat-topped oxide region, according to an embodiment of the present invention.

FIG. 5 illustrates a cross-section of an example memory cell structure 100 including a flat-topped floating gate with an overlying flat-topped oxide region, according to an embodiment of the present invention. Memory cell structure 100 includes a floating gate 104 formed over a substrate 102, and a flat-topped oxide region or "oxide cap" 106 formed over the floating gate 104, and a spacer layer 108 (e.g., nitride layer) formed over the floating gate 104/oxide 106 structure. Flat-topped oxide region 106 may be formed by forming a "football oxide" over a floating gate structure and a subsequent oxide deposit and processing to collectively define a flat-topped oxide region 106, e.g., using the process shown in FIGS. 6A-6F discussed below or other similar or suitable process. In some embodiments, oxide region 106 may be relatively thick (in the vertical direction), as compared with the underlying floating gate 104, as discussed in more detail below with reference to FIG. 6F.

Due to the shape of the floating gate structure, spacer layer 108 may include generally vertically-extending regions 108A that are aligned over floating gate tips 15. These vertically-extending spacer layer regions 108A, along with the thick oxide cap 106, may help protect the underlying floating gate tips 15 from receiving dopant during a source implant or other relevant dopant implant process, which may prevent or reduce the extent of any dulling or blunting of floating gate tips 15 resulting from the doping process (e.g., after a subsequent oxidation process), e.g., as discussed above in the Background section. In addition, the oxide cap 106 and spacer 108 may avoid any cell asymmetry problems by allowing the source implant to be self-aligned to the floating gate.

The example structure shown in FIG. 5 may be applied or incorporated in any suitable memory cell, e.g., SuperFlash or other flash memory cells having one or more floating gates 104. For example, FIGS. 7A and 7B discussed below illustrate an example process for forming a flash memory cell including forming a pair of floating gates formed as shown in FIG. 5, and then performing an HVII source implant, wherein the respective spacer layer regions 108A add protection to the underlying floating gate tips 15 from the doping process.

FIGS. 6A-6F illustrate an example process for forming the flat-topped floating gate structure shown in FIG. 5, according to one embodiment of the present invention.

Figure 6A:
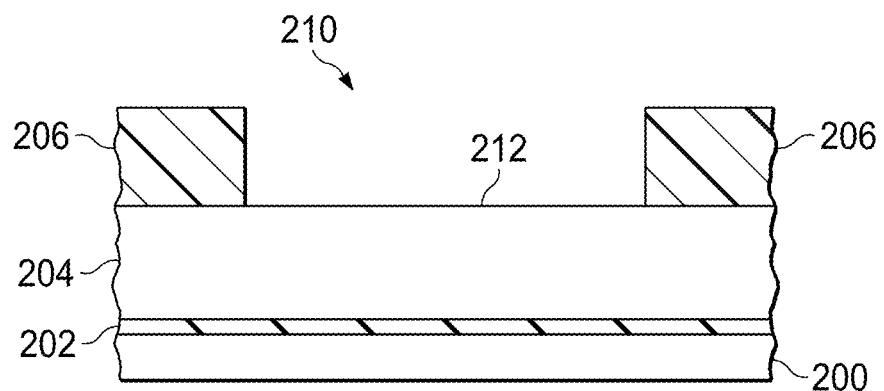
FIGS. 6A-6F illustrate an example process for forming a flat-topped floating gate structure having a protective nitride spacer as shown in FIG. 5, according to one embodiment of the present invention.

As shown in FIG. 6A, a gate oxide layer 202 may be grown or otherwise formed on a wafer substrate 202. A polysilicon layer 204, which will define a floating gate after further processing, may be deposited over the gate oxide 202. A mask layer 206 may be deposited over poly layer 204, and mask layer 206 may be patterned and etched to define an opening 210 that exposes a top surface 212 of poly layer 204. In this example embodiment, mask layer 206 comprises silicon nitride.

Figure 6B:
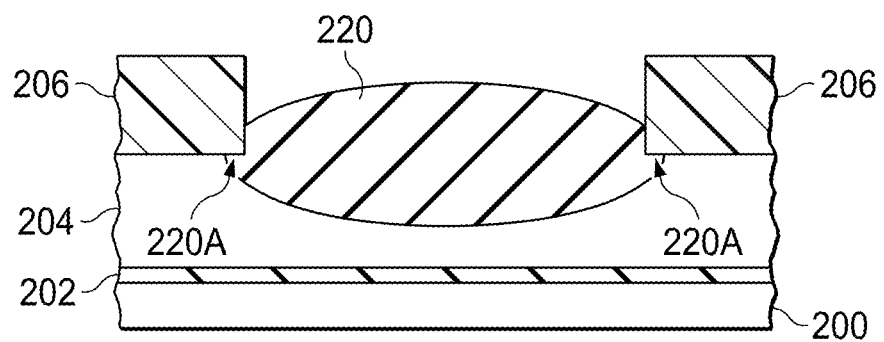

As shown in FIG. 6B, a floating gate oxide 220 is grown at the exposed surface 212 of polysilicon 204 in the silicon nitride opening 210. As shown, floating gate oxide 220 may grow to an oval or football shape, and may thus be referred to as a "football oxide." In addition, floating gate oxide 220 may extend partially under silicon nitride regions 206, e.g., as indicated at 220A.

Figure 6C:
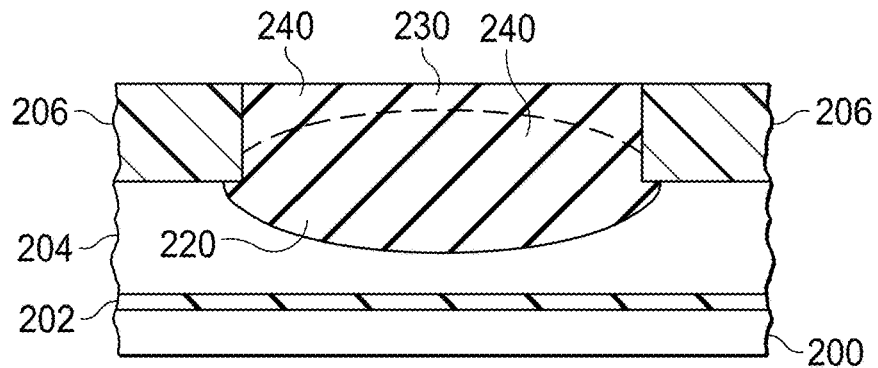

As shown in FIG. 6C, the area above floating gate oxide (football oxide) 220 and between silicon nitride regions 206 may be filled with oxide 240, e.g., by an HDP oxide deposition. A chemical mechanical planarization (CMP) may then be performed to remove oxide from the top surface of silicon nitride regions 206, leaving HDP oxide only in the opening between silicon nitride regions 206, as shown in FIG. 6C. The floating gate oxide (football oxide) 220 and HDP oxide 240 may collectively define a flat-topped oxide region or "cap" 240.

Figure 6D:
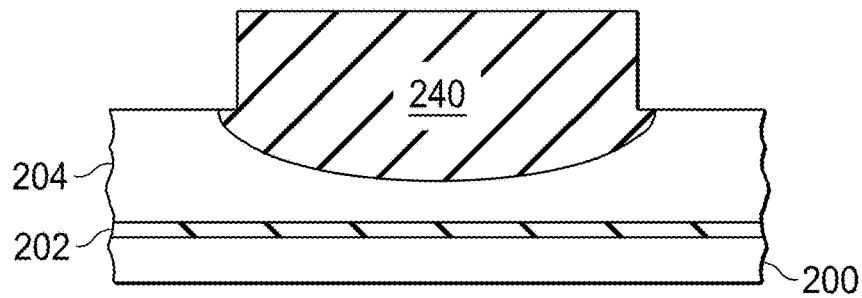

As shown in FIG. 6D, remaining portions of silicon nitride layer 206 may be removed, e.g., by any suitable nitride removal process.

Figure 6E:
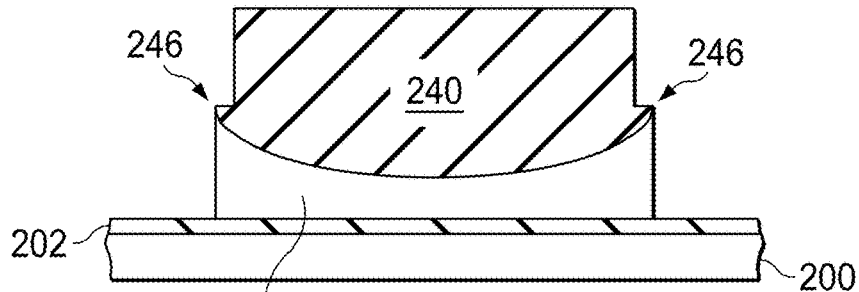

As shown in FIG. 6E, a floating gate etch may be performed to remove areas of polysilicon layer 204 uncovered by oxide region 240, and thereby define a floating gate structure 244 having upwardly-pointing tip regions 246 at the lateral edges or the circumference of floating gate structure 244. One or more of such floating gate tip regions 246 may define a conductive path to an adjacent gate, word line, etc., during operation of the memory cell that includes floating gate 244. In some embodiments, the floating gate etch may comprise a plasma etch process.

Figure 6F:
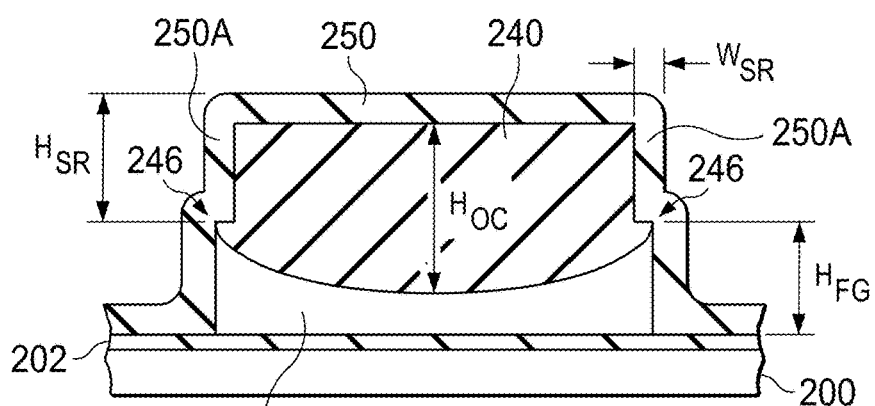

As shown in FIG. 6F, a spacer film or layer 250, e.g., a silicon nitride spacer film, may be deposited over the structure. Due to the shape of the floating gate 244 and overlying flat-topped oxide region 240, spacer layer 250 may define a vertically-extending region, or "shielding region" 250A aligned over each floating gate tip region 246. As discussed above regarding FIG. 5, these vertically-extending regions 250A may add protection against the underlying floating gate tips 246 becoming doped during a subsequent dopant implant, e.g., an HVII source implant, which may prevent or reduce the dulling of floating gate tips 246 that commonly results during conventional manufacturing processes. In some embodiments, spacer layer 250 may be removed after the dopant implant. In other embodiments, spacer layer 250 may be left in place.

Referring to FIG. 6F, in some embodiments, the process may be performed such that oxide cap 240 is relatively thick (in the vertical height direction) as compared with the underlying floating gate 244. For example, in some embodiments, a maximum thickness or height Hoc of oxide cap 240 is greater than a maximum thickness or height $H_{FG}$ of floating gate 244. In some embodiments, the oxide cap height $H_{OC}$ is at least 1.5 times as great as the floating gate height $H_{FG}$. In particular embodiments, the oxide cap height $H_{OC}$ is at least 2 times as great as the floating gate height $H_{FG}$.

Referring to FIG. 6F, in some embodiments, the process may be performed such that a vertical height of each shielding region 250A of spacer layer 250, indicated at $H_{SR}$, is greater than a lateral width of the respective shielding region 250A, indicated at $W_{SR}$. In some embodiments, the shielding region height $H_{SR}$ is at least 1.5 times as great as the shielding region width $W_{SR}$. In some embodiments, the shielding region height $H_{SR}$ is at least 2 times as great as the shielding region width $W_{SR}$. In some embodiments, the shielding region height $H_{SR}$ is at least 3 times as great as the shielding region width $W_{SR}$.

Figure 7:
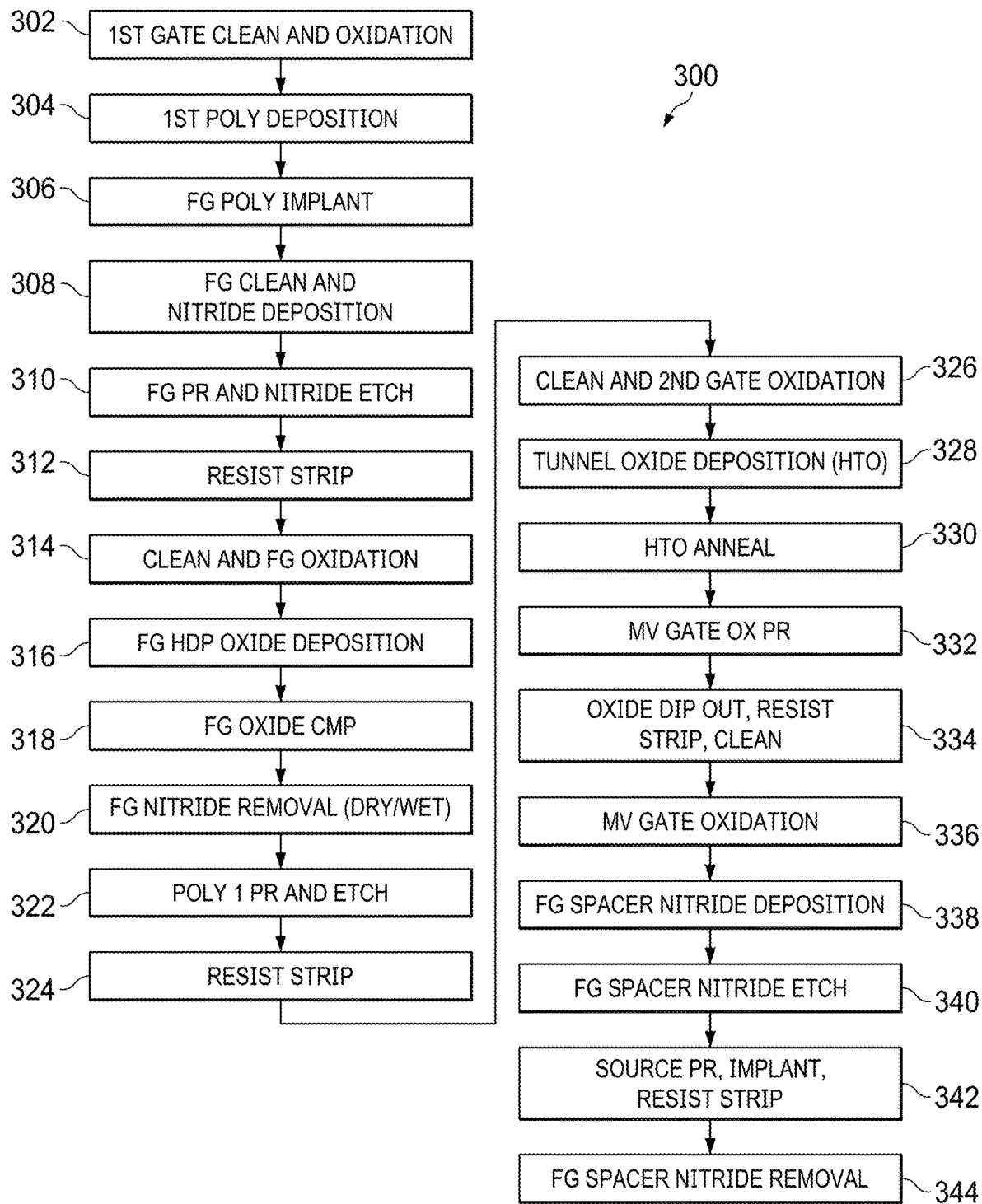
FIG. 7 shows an example process flow for forming the flat-topped floating gate structure having a protective nitride spacer as shown in FIG. 5, and performing a source implant, according to one embodiment of the present invention.

FIG. 7 shows an example process flow 300 for forming the flat-topped floating gate structure having a protective nitride spacer as shown in FIG. 5, and performing a source implant, according to one embodiment of the present invention. At 302, a gate clean and oxidation is performed on a top surface of a wafer substrate. At 304, a FG poly (poly1) layer is deposited over the substrate. At 306, a FG poly implant is performed. At 308, a FG nitride clean and deposition is performed. At 310, a FG photoresist is formed and patterned and a FG nitride etch is performed. At 312, a resist strip is performed. At 314, the structure is cleaned and a FG oxidation is performed.

At 316, an HDP oxide deposition is performed over the floating gate structure, with a selected oxide thickness, e.g., in the range of 1000 Å-2500 Å, or in the range of 1300 Å-2000 Å, or in the range of 1500 Å-1800 Å. At 318, a FG oxide CMP is performed, e.g., to a depth that leaves approximately 1200 Å of the nitride layer. At 320, a FG nitride removal may be performed, e.g., a dry or wet removal process. In one embodiment, e.g., a plasma etch is performed to remove the approximately 1200 Å nitride thickness. At 322, a photoresist (e.g., poly oxide poly or "POP" photoresist) is formed and patterned, and an FG etch is performed. At 324, a resist strip is performed.

At 326, the structure is cleaned and a second gate oxide oxidation is performed. At 328, a tunnel oxide deposition (HTO) is performed. At 330, an HTO anneal is performed. At 332, a medium voltage (MV) gate oxide photoresist is formed. At 334, the photoresist is stripped, and the structure is cleaned. In some embodiments an oxide "dip out" process may be performed to remove remaining oxide, e.g., using hydrofluoric acid, leaving the bare silicon surface ready for oxidation again.

At 336, an MV gate oxidation is performed. At 338, an FG spacer nitride is deposited. At 340, the FG spacer nitride may be etched. At 342, a source photoresist may be deposited, patterned and etched to protect selected areas of the structure, and an HVII source implant is performed. As discussed above, the FG nitride spacer may include vertically-extending regions aligned over the upper corners or tips of the floating gate, which act as shields that protect against the HVII dopant from penetrating down into the FG poly, to thereby maintain the acuteness of the floating gate tips. A resist strip may then be performed. At 344, the FG nitride spacer may be removed for subsequent processing of the cell. For example, a tunnel oxide layer may be grown over the structure, followed by depositing and etching a poly2 layer to form a word line, erase gate and/or other program or erase nodes.

FIGS. 8A and 8B illustrate steps of an example process for forming a flash memory cell with a pair of floating gates, a pair of word lines, and a common erase/coupling gate formed between the floating gates and over the source region, including the techniques shown in FIGS. 6A-6F and/or FIG. 7, according to one embodiment of the invention.

As shown in FIG. 8A, a pair of floating gates 444 having overlying flat-topped oxide regions 440 is formed over a substrate 400, and a spacer layer (e.g., silicon nitride layer) 450 is deposited over the flat-topped floating gate structures, e.g., using any of the techniques disclosed herein. A source implant (e.g., HVII implant) may then be performed as shown to define a source region (e.g., after diffusion of the source dopant through the substrate). As discussed above, spacer layer regions 450A aligned over floating gate tips 446 may help protect the floating gate tips 446 from the source implant, which may prevent or reduce a dulling of floating gate tips 446, as discussed above.

As shown in FIG. 8A, a pair of floating gates 444 having overlying flat-topped oxide regions 440 is formed over a substrate 400, and a spacer layer (e.g., silicon nitride layer) 450 is deposited over the flat-topped floating gate structures, e.g., using any of the techniques disclosed herein. A source implant (e.g., HVII implant) may then be performed as shown to define a source region (e.g., after diffusion of the source dopant through the substrate). As discussed above, spacer layer regions 450A aligned over floating gate tips 446, along with thick oxide caps 440, may protect the floating gate tips 446 from the source implant, which may prevent or reduce a dulling of floating gate tips 446, as discussed above.

As shown in FIG. 8B, after removing the nitride spacer layer 450, a polysilicon layer (e.g., poly-2 layer) may be deposited and etched to define a respective word line (WL) over an exterior side/edge of each floating gate 444 and an erase gate or "coupling gate" (EG/CG) over the interior edges of the floating gates and over the underlying source region. The structure shown in FIG. 8B may be define or be associated with a SuperFlash memory cell (e.g., a SuperFlash EFS1+ cell, or EFS1 erase cell) by Microchip Technology Inc. having a headquarters at 2355 W Chandler Blvd, Chandler, Ariz. 85224. In this manner, the source implant may be performed prior to forming the poly-2 layer, e.g., including the word lines WL and/or an erase/coupling gate. This may allow for a lower source implant energy and also for process tuning for a spacer of variable width. Allowing control over these process parameters may also increased control of the source implant diffusion length (e.g., lateral diffusion distance) beneath each respective floating gate, to thereby control one or more operational parameters of the resulting memory cells.

What is claimed is:

1. A method of forming a memory cell structure, the method comprising:
    forming a polysilicon layer over a substrate;
    depositing mask material over the polysilicon layer;
    etching an opening in the mask material to expose a top surface of the polysilicon layer;
    growing a floating gate oxide at the exposed top surface of the polysilicon layer;
    depositing additional oxide in the opening in the mask material and above the floating gate oxide, wherein the floating gate oxide and the additional oxide collectively define an oxide cap;
    removing mask material adjacent lateral sides of the oxide cap; and
    performing a floating gate etch to remove portions of the polysilicon layer uncovered by the oxide cap, wherein a remaining portion of the polysilicon layer defines a floating gate structure including an upwardly-pointing floating gate tip;
    depositing a spacer layer over the oxide cap and underlying floating gate structure, wherein the spacer layer includes a shielding region laterally aligned over the upwardly-pointing floating gate tip;
    performing a source implant for forming a source region in the substrate, wherein the shielding region of the spacer layer shields the underlying floating gate tip from the source implant; and
    after the source implant, forming an erase gate or coupling gate over the source region and adjacent the upwardly-pointing floating gate tip.

2. The method of claim 1, wherein the oxide cap is formed with a flat top surface.

3. The method of claim 1, comprising performing a chemical mechanical planarization (CMP) on the additional oxide to define a flat top surface of the oxide cap.

4. The method of claim 1, wherein the spacer layer comprises silicon nitride.

5. The method of claim 1, wherein the shielding region of the spacer layer extends vertically.

6. The method of claim 5, wherein a vertical height of the vertically-extending shielding region of the spacer layer is greater than a lateral width of the shielding region.

7. The method of claim 6, wherein the vertical height of the vertically-extending shielding region of the spacer layer is at least two times as great as the lateral width of the shielding region.

8. The method of claim 6, wherein the vertical height of the vertically-extending shielding region of the spacer layer is at least three times as great as the lateral width of the shielding region.

9. A method of forming a memory cell structure, the method comprising:
    forming a polysilicon layer over a substrate;
    depositing mask material over the polysilicon layer;
    etching a pair of openings in the mask material to expose a pair of top surface regions of the polysilicon layer;
    growing a floating gate oxide at each exposed top surface region of the polysilicon layer;
    depositing additional oxide in each of the pair of openings in the mask material and above each respective floating gate oxide, wherein each floating gate oxide and the additional oxide deposited over that floating gate oxide collectively defines an oxide cap;
    removing mask material adjacent lateral sides of each oxide cap; and
    performing a floating gate etch to remove portions of the polysilicon layer uncovered by each oxide cap, wherein remaining portions of the polysilicon layer define a pair of spaced apart floating gate structures, each including an upwardly-pointing floating gate tip;
    depositing a spacer layer including a shielding region laterally aligned over the upwardly-pointing floating gate tip of each floating gate structure;
    performing a source implant between the pair of floating gate structures, wherein the shielding region of the spacer layer aligned over each upwardly-pointing floating gate tip shields the underlying floating gate tip from the source implant; and
    after the source implant, forming an erase gate or coupling gate over the source region and adjacent the upwardly-pointing floating gate tips of the pair of floating gate structures.

10. The method of claim 9, wherein each oxide cap is formed with a flat top surface.

11. A method of forming a memory cell structure, comprising:
    forming a floating gate over a substrate; and
    forming an oxide cap over the floating gate by:
        growing an oval shaped oxide region at a top surface of the floating gate, wherein the growing the oval shaped oxide region defines first and second upwardly-pointing tip regions of the floating gate at opposing lateral sides of the floating gate; and
        depositing an upper oxide region on top of the oval shaped oxide region;
        wherein the deposited upper oxide region has a smaller lateral width than the underlying floating gate at each of the opposing lateral sides of the floating gate such that at each of the opposing lateral sides of the floating gate, a vertically-extending sidewall of the upper oxide region is offset from a vertically-extending sidewall of the underlying floating gate in a direction toward a center of the floating gate.

12. The method of claim 11, wherein the upper oxide region of the oxide cap has a flat top surface.

13. The method of claim 11, further comprising forming a spacer layer over the oxide cap and underlying floating gate, wherein the spacer layer includes a shielding region laterally aligned over an upwardly-pointing tip region of the floating gate, the shielding region being configured to protect the floating gate tip region during a dopant implant process.

14. The method of claim 11, further comprising:
- forming a spacer layer over the oxide cap and underlying floating gate, wherein the spacer layer includes a shielding region laterally aligned over each of the first and second upwardly-pointing floating gate tip regions and configured to protect the first and second upwardly-pointing floating gate tip regions during a dopant implant process;
- forming a wordline adjacent the first upwardly-pointing floating gate tip region, the wordline configured for read or write operations through the first upwardly-pointing floating gate tip region and the wordline; and
- forming an erase gate adjacent the second upwardly-pointing floating gate tip region, the erase gate configured for erase operations through the second upwardly-pointing floating gate tip region and the erase gate.

\* \* \* \* \*